(12) United States Patent
Craig et al.

(10) Patent No.: US 9,154,097 B2
(45) Date of Patent: *Oct. 6, 2015

(54) AUDIO SYSTEM INCLUDING MULTIBAND AUDIO DYNAMICS PROCESSOR

(71) Applicant: Panasonic Automotive Systems Company of America, Division of Panasonic Corporation of North America, Peachtree City, GA (US)

(72) Inventors: Larry V. Craig, Plymouth, MI (US); Michael T. Burk, Peachtree City, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/302,800

(22) Filed: Jun. 12, 2014

(65) Prior Publication Data

US 2014/0294203 A1 Oct. 2, 2014

Related U.S. Application Data

(63) Continuation of application No. 14/038,816, filed on Sep. 27, 2013, now Pat. No. 8,787,596, and a continuation of application No. 13/709,462, filed on Dec. 10, 2012, now Pat. No. 8,577,059, and a continuation of application No. 13/461,218, filed on May 1, 2012, now Pat. No. 8,385,565, and a continuation of application No. 12/316,689, filed on Dec. 17, 2008, now Pat. No. 8,204,258.

(51) Int. Cl.
*H03G 3/00* (2006.01)
*H03G 3/20* (2006.01)
*H03G 9/18* (2006.01)

(52) U.S. Cl.
CPC ... *H03G 3/20* (2013.01); *H03G 9/18* (2013.01)

(58) Field of Classification Search
CPC .......................................................... H03G 3/00
USPC .................................................. 381/107, 108
See application file for complete search history.

(56) References Cited

U.S. PATENT DOCUMENTS 7,171,010 B2 * 1/2007 Martin et al. .................... 381/98
8,036,402 B2 * 10/2011 Furge ............................. 381/120
8,787,596 B2 * 7/2014 Craig et al. .................... 381/107

* cited by examiner

*Primary Examiner* — Phuc Dang
(74) *Attorney, Agent, or Firm* — Laurence S. Roach, Esq.

(57) ABSTRACT

An audio system includes a level controller receiving an input audio signal from an audio medium. The level controller includes a gain adjust module producing an output audio signal based on the input audio signal. A filter arrangement is communicatively coupled to the level controller. The filter arrangement receives the output audio signal and divides the output signal into a plurality of filtered signals. Each of the filtered signals corresponds to a respective frequency band. A multiband dynamics controller is communicatively coupled to the filter arrangement. The multiband dynamics controller receives the filtered signals and applies a respective gain characteristic to each of the filtered signals to thereby produce a plurality of gain adjust signals. The gain adjust signals are combined into a multiband dynamics controller output signal.

20 Claims, 10 Drawing Sheets

AUDIO SYSTEM INCLUDING MULTIBAND AUDIO DYNAMICS PROCESSOR

CROSS-REFERENCE TO RELATED APPLICATION

This application is a continuation of U.S. patent application Ser. No. 14/038,816, filed on Sep. 27, 2013, now U.S. Pat. No. 8,787,596, issued on Jul. 22, 2014, which is a continuation of US patent application Ser. No. 13/709,462, filed on Dec. 10, 2012, now U.S. Pat. No. 8,577,059, issued on Nov. 5, 2013, which is a continuation of U.S. patent application Ser. No. 13/461,218, filed on May 1, 2012 which is now U.S. Pat. No. 8,385,565, issued on Feb. 26, 2013, which is a continuation of U.S. patent application Ser. No. 12/316,689, filed on Dec. 17, 2008, which is now U.S. Pat. No. 8,204,258, issued on Jun. 19, 2012, the disclosures of which are hereby incorporated by reference in their entireties for all purposes.

BACKGROUND OF THE INVENTION

1. Field of the Invention

The present invention relates to the improvement of sound characteristics in an audio system.

2. Description of the Related Art

Various techniques have been developed to enhance the perceived quality of audio signals. One of these techniques is dynamic range compression (DRC), which is a process that manipulates the dynamic range of an audio signal. Compression may be used during broadcasting in order to alter the perceived volume of audio.

Compression may be achieved by use of a compressor, which is sometimes referred to as an automatic volume control. Compression may reduce the level of loud sounds over a certain threshold, while the level of quiet sounds is not reduced. Thus, compression may reduce the dynamic range of an audio signal. Compression may be performed to improve aesthetics of the sound, to accommodate technical limitations of audio equipment, or to improve the audibility of audio signals in noisy environments.

Quiet sounds may be overpowered in a noisy environment, making them difficult to hear. That is, the background noise can drown out quiet sounds. Reducing the sound level for loud sounds may result in the quiet sounds being inaudible. Conversely, increasing the sound level for quiet sounds may result in the loud sounds being uncomfortably loud. Compression may be used to make both the quiet and loud parts of an audio signal audible at a comfortable level at the same time. Compression reduces the level of the loud sounds, but does not reduce the level of the quiet sounds. Thus, the sound level may be raised such that the quiet sounds are audible, but the loud sounds are not too loud.

The length of time required for a compressor to respond to changes in input level is known as attack time. The length of time required for the sound level to fall from a maximum level to a steady state level is referred to as decay time. The length of time the audio level remains at the steady state level is referred to as the hold time. The length of time required for a compressor to return to no gain reduction after the input level falls below a steady state or threshold level is known as release time. In many compressors, the use may adjust the attack and release times. Some compressors, however, have fixed attack and release times that are determined by the circuit design and that cannot be adjusted by the user. In some cases, the attack and release times are "automatic" or "program dependent." That is, the times change depending upon the input signal. The loudness pattern of the source material may be modified by the compressor, the compressor may change the character of the signal in very noticeable ways under certain settings.

Accordingly, what is neither anticipated nor obvious in view of the prior art is an improved apparatus and method of source level matching both when operating within a single audio medium and when switching between audio media.

SUMMARY OF THE INVENTION

One embodiment of the multiband audio dynamics processor of the present invention has three main elements, including an automatic level control (ALC), a multiband filter, and a multiband dynamics controller. The ALC section may reduce the difference in level between the loudest and quietest audio sources. By using a "slow" root mean square (RMS) detector, the long term RMS level is monitored and maintained, thereby allowing fast transients to remain. This helps to maintain the dynamics of the source. A control signal is also output in order to freeze or hold the gain setting of the multiband dynamics controller when the input falls below a specified threshold.

The multiband filter section may divide the input source into multiple frequency ranges. In one embodiment, four frequency bands and first order filter sections are utilized. In a particular embodiment, the first band (B1) is 0-100 Hz, the second band (B2) is 100 Hz-600 Hz, the third band (B3) is 600 Hz-4 kHz, and the fourth band (B4) is 4 kHz-20 kHz and over. The filter types chosen may allow for seamless recombining for a flat frequency response (+/−0.1 dB).

The multiband dynamics controller may apply audio source-derived gain adjustments on a band-by-band basis. The RMS detector elements of the multiband dynamics controller may respond and apply gain adjustments much more quickly than RMS detector elements located within the ALC. Each band may have independently adjustable RMS tables, attack, decay, and hold times. Because most of the energy below 100 Hz is monotone in nature, the left/right bands are summed and controlled together in order to increase efficiency. The gain applied to the individual bands is a function of the input signal, the status of the freeze/hold signal, the respective bands' RMS table output, and the gain pullback control. If the post ALC signal level falls below the specified threshold, the last RMS table output (Gain value) will be held until this level exceeds the threshold value. This is done to prevent abrupt gain changes during quiet music passages. RMS table output gain values are a function of the input levels of their respective bands and the compressor characteristics assigned to them. The B2 and B3 bands for the left and right channels are summed together in order to create the signal used to control the pullback function. The pullback function is required in order to prevent overload of the output signal that may result when the individual bands are summed back together to recreate the full audio spectrum left/right channels.

The present invention may provide source level matching both in situations where audio is sourced from two different types of audio media and in situations where a single type of audio medium provides multiple sources of audio. Source levels for a given source (e.g., a compact disc) can vary significantly, and thus source level matching is beneficial. Improved source level matching with an automatic level control function reduces the need for the end user to adjust the volume in response to switching between different sources. This may be especially advantageous in higher noise environments such as an automobile, or when using a portable audio player and wearing headphones.

The multiband dynamics controller may provide two primary functions. One of the functions is to apply a dynamic, source-dependent equalization. The other of the functions is to increase the energy density of the output signal at higher levels (e.g., frequency levels). The result is a more powerful sound characteristic. This second function may be applicable to automotive and portable audio player markets.

The invention comprises, in one form thereof, an audio system including an automatic level controller receiving at least one input audio signal from at least one audio medium. The automatic level controller includes a gain adjust module for producing an output audio signal based on the at least one input audio signal. A difference between a maximum sound level and a minimum sound level of the at least one input audio signal is greater than a difference between a maximum sound level and a minimum sound level of the output audio signal. A filter arrangement is communicatively coupled to the automatic level controller. The filter arrangement receives the output audio signal and divides the output signal into a plurality of filtered signals. Each of the filtered signals corresponds to a respective frequency band. A multiband dynamics controller is communicatively coupled to the filter arrangement. The multiband dynamics controller receives the filtered signals and applies a different respective gain characteristic to each of the filtered signals to thereby produce a plurality of gain adjust signals. The gain adjust signals are combined into a multiband dynamics controller output signal.

The invention comprises, in another form thereof, a method of operating an audio system, including receiving at least one input audio signal from at least one audio medium. An output audio signal is produced based on the at least one input audio signal. A difference between a maximum sound level and a minimum sound level of the at least one input audio signal is greater than a difference between a maximum sound level and a minimum sound level of the output audio signal. The output signal is divided into a plurality of filtered signals. Each of the filtered signals corresponds to a respective frequency band. A different respective gain characteristic is applied to each of the filtered signals to thereby produce a plurality of gain adjust signals. A value of the gain characteristic is held constant so long as a level of the output audio signal is below a threshold value. The gain adjust signals are combined into a controller output signal.

The invention comprises, in yet another form thereof, an audio system including an automatic level controller for receiving at least one input audio signal from at least one audio medium. The automatic level controller includes a gain adjust module for producing an output audio signal based on the at least one input audio signal. A difference between a maximum sound level and a minimum sound level of the at least one input audio signal is greater than a difference between a maximum sound level and a minimum sound level of the output audio signal. A threshold detector module is communicatively coupled to the gain adjust module and receives the output audio signal. The threshold detector module transmits a gate control signal when the output audio signal falls below a predetermined threshold value. A filter arrangement is communicatively coupled to the automatic level controller. The filter arrangement receives the output audio signal and divides the output audio signal into a plurality of filtered signals. Each of the filtered signals corresponds to a respective frequency band. A multiband dynamics controller is communicatively coupled to the filter arrangement. The multiband dynamics controller receives the filtered signals and applies a different respective gain characteristic to each of the filtered signals to thereby produce a plurality of gain adjust signals. The multiband dynamics controller also receives the gate control signal and limits at least one of the gain adjust signals to a maximum value in response to receiving the gate control signal. The gain adjust signals are combined into a multiband dynamics controller output signal by the multiband dynamics controller.

An advantage of the present invention is that it produces a more powerful sound characteristic than known methods.

Another advantage is that the present invention may reduce the need for the end user to adjust the volume when the audio system switches between different sources.

Yet another advantage is that the present invention reduces noise in the audio output.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
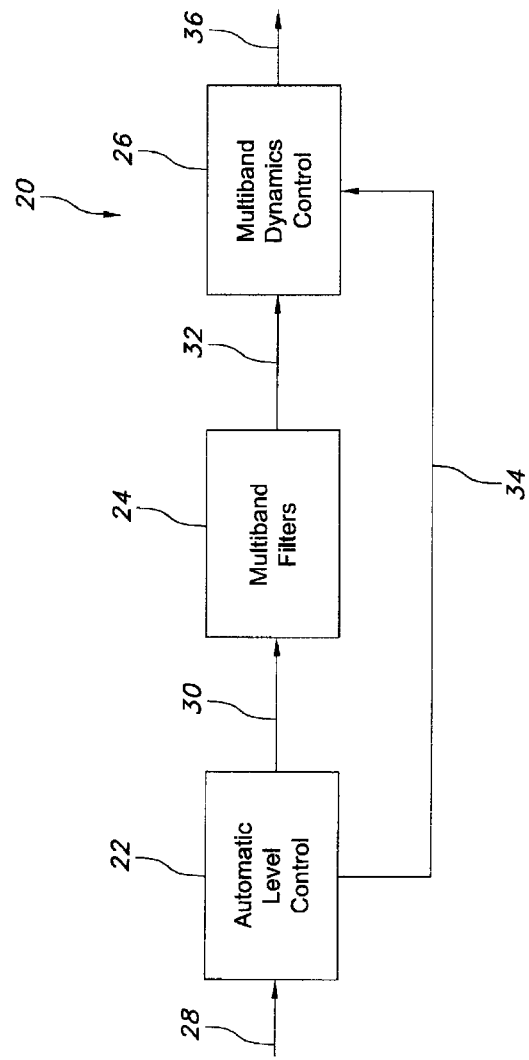
FIG. 1 is a block diagram of one embodiment of a multiband audio dynamics processor of the present invention.

Referring now to the drawings, and particularly to FIG. 1, there is shown one embodiment of a multiband audio dynamics processor 20 including an automatic level controller (ALC) 22, multiband filters 24, and multiband dynamics controller (MDC) 26. An audio signal in the form of a source input 28 may be received by ALC 22. Source input 28 may be from a radio, compact disc (CD) player, or other audio signal medium. The medium from which source input 28 is sourced may vary with time. That is, the user may manually switch the audio system between radio and CD player, or the audio system may automatically switch itself between radio and CD player. ALC 22 may reduce the difference in sound level between the loudest and quietest audio sources. ALC 22 may output another audio signal 30 having adjusted sound levels. Output signal 30 from ALC 22 may be received by multiband filters 24.

Multiband filters 24 may divide ALC output signal 30 into multiple frequency bands, each of which may be associated with a certain type of sound generator that may typically produce the sounds present in signal 30. That is, various generators of sound, such as a human voice and various types of musical instruments, such as strings, horns, percussion, etc., may produce sounds predominantly within certain frequency bands. Multiband filters 24 may divide ALC output signal 30 into frequency bands that each correspond to the frequencies produced by a respective producer of sounds found in signal 30. Multiband filter 24 may output yet another audio signal 32 that has adjusted sound levels and that is divided into multiple frequency bands. Thus, audio signal 32 may actually be in the form of multiple signals, each corresponding to a respective on of the frequency bands. Output signal(s) 32 from multiband filters 24 may be received by MDC 26.

MDC 26 may apply a different gain value to each of the bands of signal 32. ALC 22 may transmit a gate control signal 34 to MDC 26 that prevents the gain values from exceeding a maximum value when the input audio signal falls below a predetermined threshold value. MDC 26 produces a final output audio signal 36 that may be received by speakers of the audio system.

Figure 2:
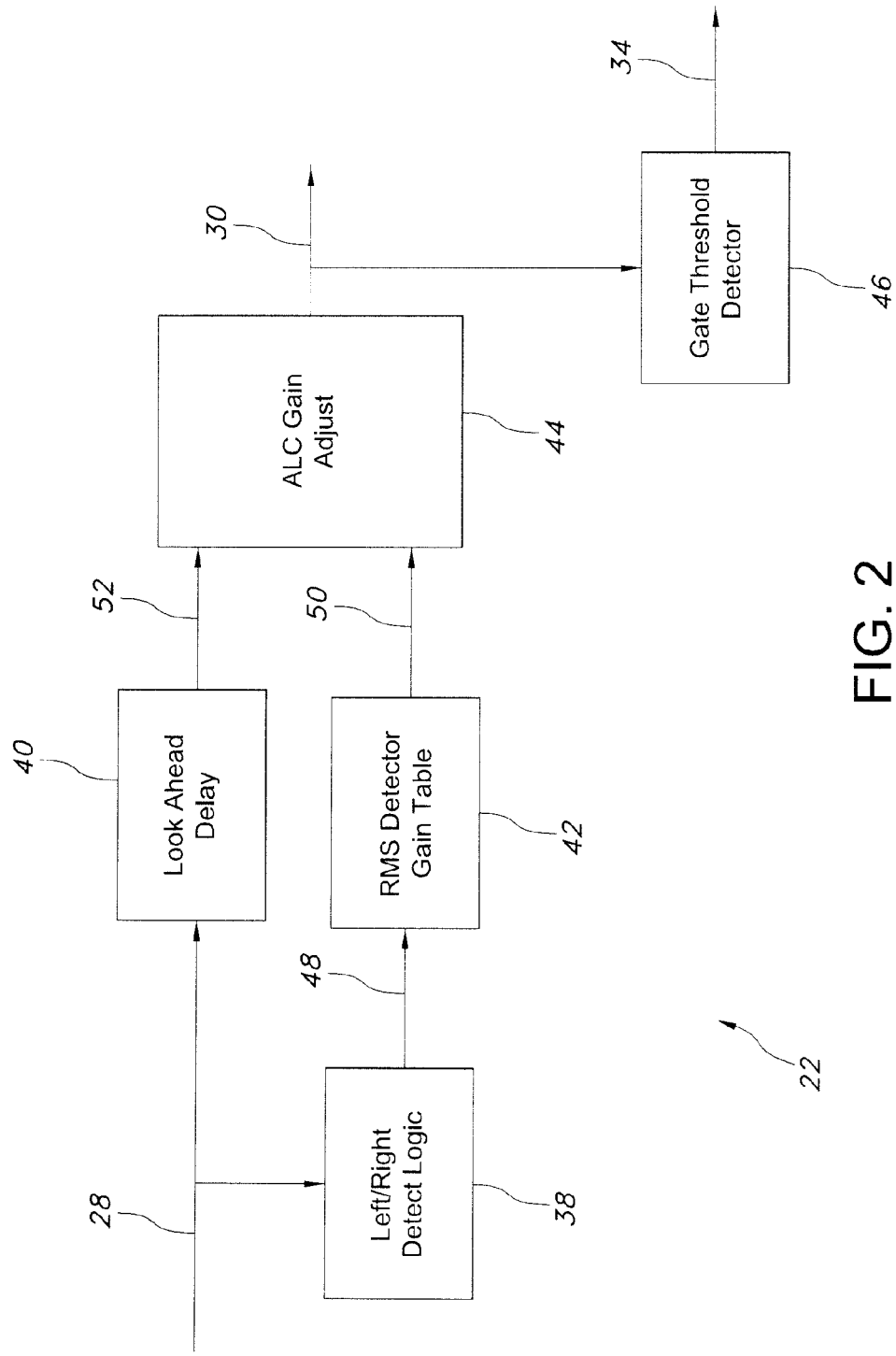
FIG. 2 is a block diagram of the automatic level control of the multiband audio dynamics processor of FIG. 1.

ALC 22 is shown in more detail in FIG. 2. ALC 22 includes Left/Right Detect Logic 38, Look Ahead Delay 40, RMS Detector Gain Table 42, ALC Gain Adjust module 44, and Gate Threshold Detector module 46. Left/right detect logic 38 transmits a left/right detect audio signal 48 to RMS Detector Gain Table 42. The long term RMS level may be monitored and maintained by use of a "slow" RMS detector. The use of the slow RMS detector may allow fast transients to remain and enable the dynamics of the source to be maintained. The output of RMS Detector Gain Table 42 may be an ALC Gain control signal 50 that may apply different gain values to the left and right channels.

ALC Gain control signal 50 is received by ALC Gain Adjust 44. ALC Gain Adjust 44 also receives a left/right delayed audio signal 52 from Look Ahead Delay 40. ALC Gain Adjust 44 transmits ALC output signal 30 to multiband filters 24. ALC output signal 30 is also received by Gate Threshold Detector 46.

Gate Threshold Detector 46 outputs gate control signal 34 to MDC 26. Gate control signal 34 freezes or holds the gain setting of MDC 26 when ALC output signal 30 falls below a specified or predetermined threshold.

Figure 3:
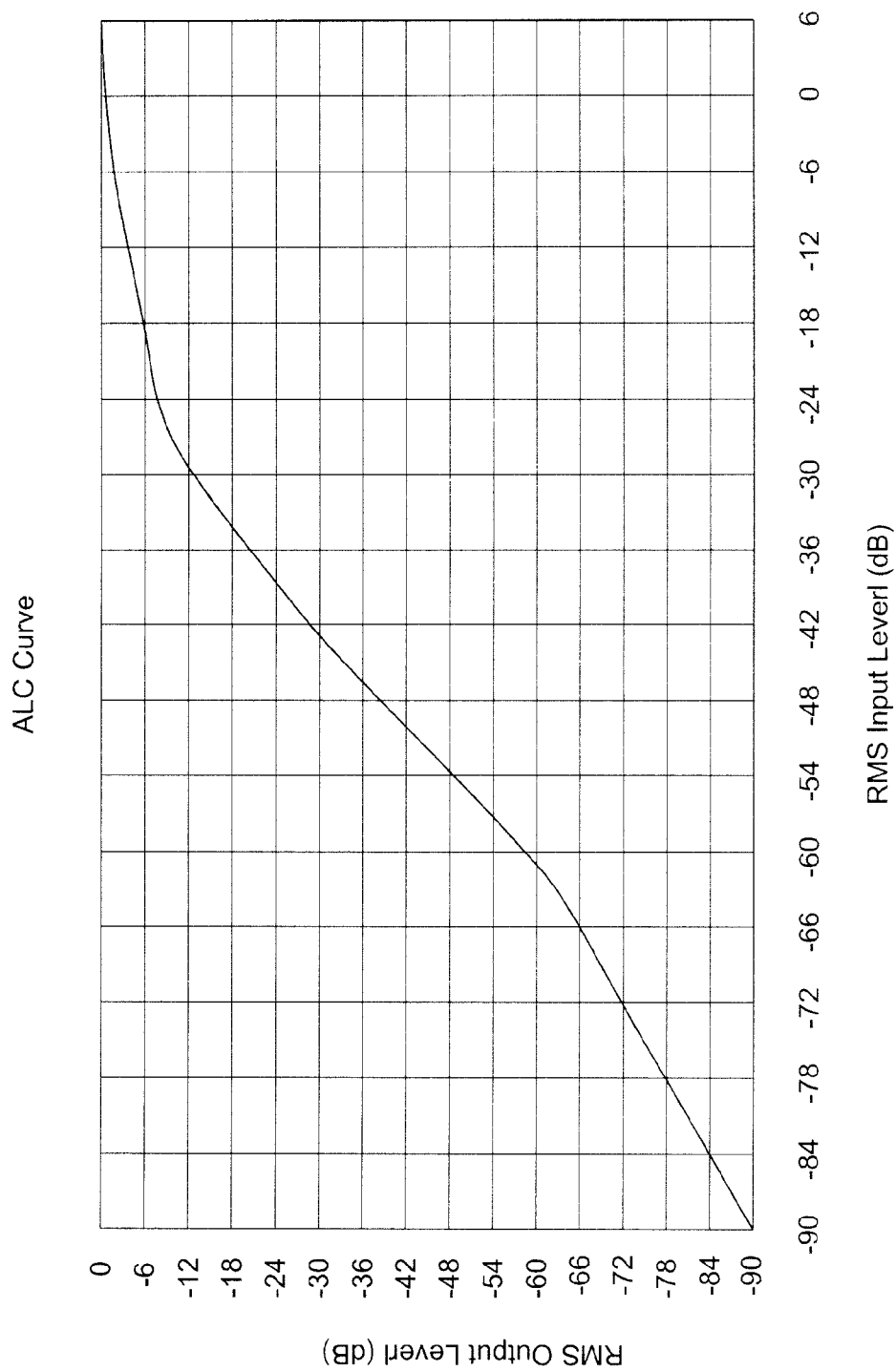
FIG. 3 is an exemplary plot of RMS output level versus RMS input level for the automatic level control of the multiband audio dynamics processor of FIG. 1.

An exemplary plot of the RMS output level of ALC 22 as a function of the RMS input level is plotted in FIG. 3.

Figure 4A:
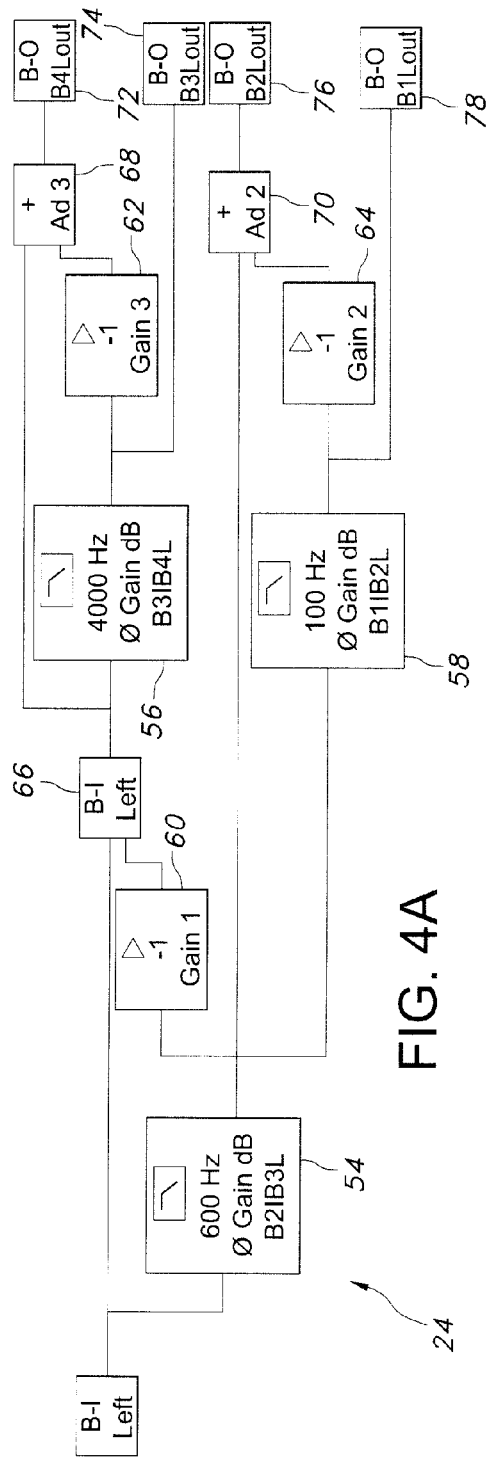
FIG. 4a is a block diagram of the left channel of the multiband filter of the multiband audio dynamics processor of FIG. 1.
Figure 4B:
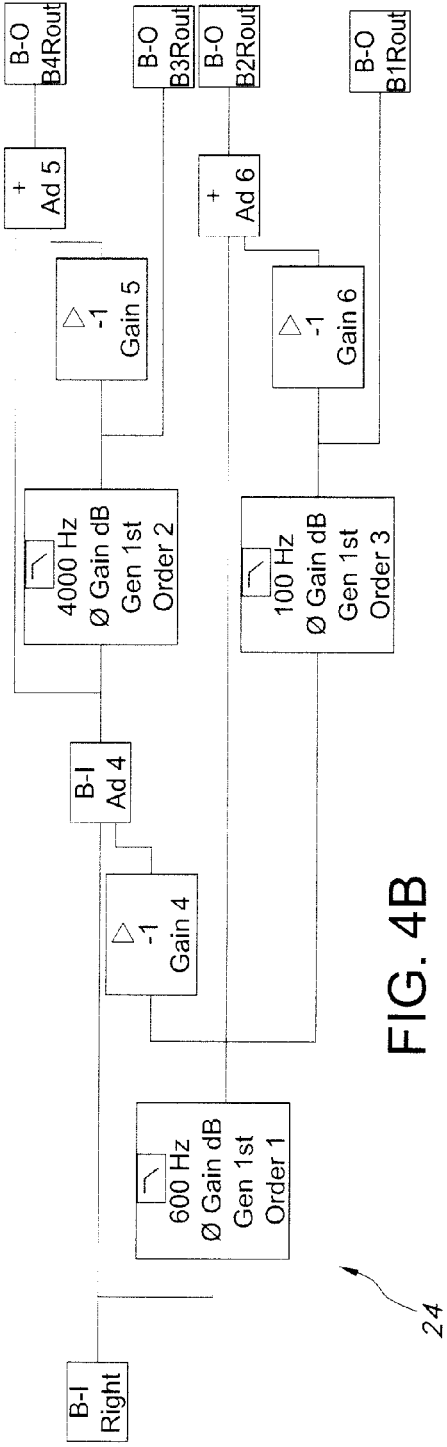
FIG. 4b is a block diagram of the right channel of the multiband filter of the multiband audio dynamics processor of FIG. 1.

As shown in FIGS. 4a and 4b, Multiband Filters 24 may divide each of the left and right input sources into multiple frequency ranges by use of lowpass filters 54, 56, 58, inverters 60, 62, 64 and adders 66, 68, 70. The specific embodiment of the portion of Multiband Filters 24 that divides the left input source into multiple frequency ranges is illustrated in FIG. 4a. Lowpass filters 54, 56, 58 have cutoff frequencies of 600 Hz, 4000 Hz and 100 Hz, respectively, resulting in output B4LOut 72 having a passband of 4000 Hz and above, output B3LOut 74 having a passband of 600 Hz to 4000 Hz; output B2LOut 76 having a passband of 100 Hz to 600 Hz; and output B1LOut 78 having a passband of 0 Hz to 100 Hz. In general, the passbands may be selected such that each passband contains at least one frequency of interest or range of frequencies of interest. For example, the passband of 100 Hz to 600 Hz includes frequencies of the human voice; the passband of 600 Hz to 4000 Hz includes frequencies of particular types of musical instruments, such as horn or strings, etc. In another embodiment (not shown), the multiband filters divide the input source into five passbands, including a first passband from 0 Hz to 100 Hz; a second passband from 100 Hz to 600 Hz; a third passband from 600 Hz to 2500 Hz; a fourth passband from 2500 Hz to 10,000 Hz; and a fifth pass band of 10,000 Hz and above. The fifth passband may include the frequencies of musical instruments such as cymbals and synthesizers.

The portion of Multiband Filters 24 that divides the right input source into multiple frequency ranges is illustrated in FIG. 4b and is substantially similar to the portion described with reference to FIG. 4a. Thus, the portion shown in FIG. 4b will not be described in detail herein in order to avoid repetition.

Figure 5:
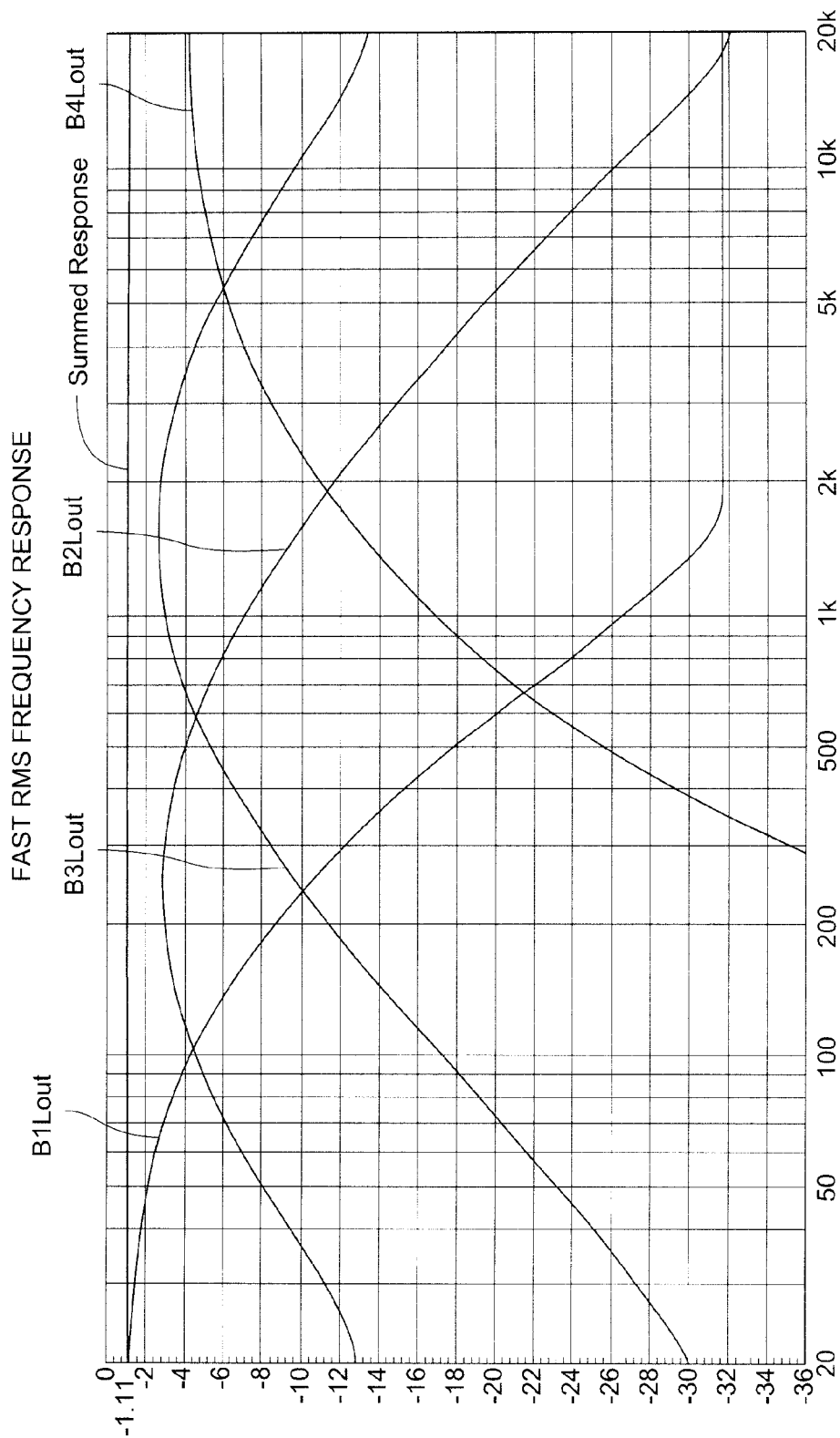
FIG. 5 is a plot of the fast RMS frequency response of the multiband filter of the multiband audio dynamics processor of FIG. 1.

FIG. 5 illustrates plots of the RMS frequency response for each of the outputs B1LOut, B2LOut, B3LOut, and B4LOut of FIG. 4a. The respective passbands of these outputs are evident in the plots. Also plotted is the constant summed response of the four filters taken as a whole. The filter types may be chosen such that the filters can be seamlessly recombined to produce a flat frequency response. In one embodiment, the combined frequency response does not deviate more that 0.1 dB in either direction.

Figure 6:
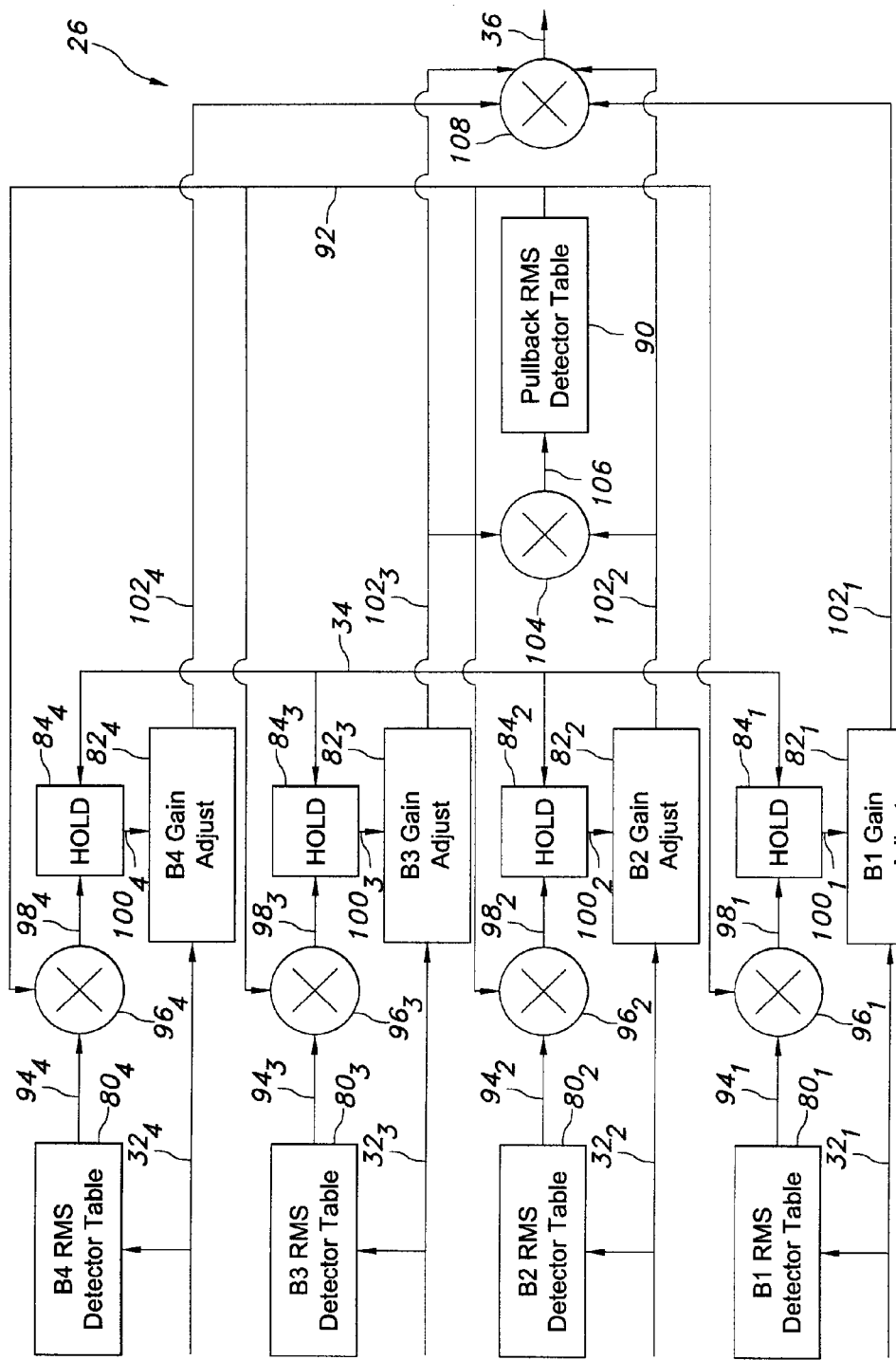
FIG. 6 is a block diagram of the multiband dynamics controller of the multiband audio dynamics processor of FIG. 1.

A more detailed block diagram of MDC 26 is illustrated in FIG. 6. A separate RMS Detector Table $80_{1-4}$ is provided for each of the four bands. RMS Detector Tables 80 each define a respective RMS detector and compressor. Detector Tables 80 may control the attack and release of the compressors. The outputs 32 of Multiband Filters 24 are received by RMS Detector Tables 80 as well as by Gain Adjusts $82_{1-4}$. These RMS detectors and Gain Adjusts may respond and apply gain adjustments more quickly than those located within ALC 22.

Hold blocks $84_{1-4}$ provide hold times and thus prevent the compressors from reducing the outputs to the level of noise, sometimes referred to as "digging to the noise floor." A different hold period may be provided for each frequency band, which may involve a subjective optimization. Each hold time may be dependent upon the threshold level of the respective compressor.

Figure 7:
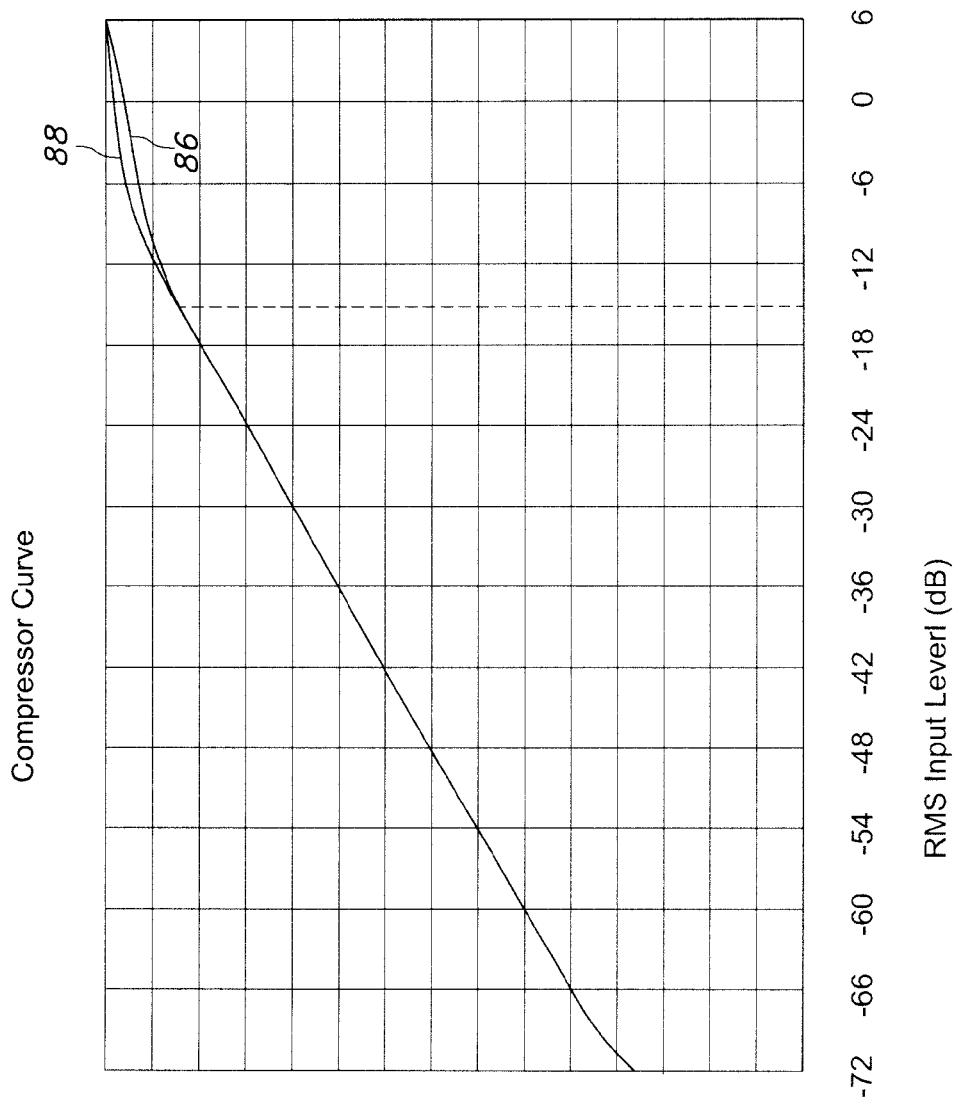
FIG. 7 is an exemplary plot of RMS output level versus RMS input level for the compressor of the multiband audio dynamics processor of FIG. 1.

A typical response curve of one or more of the compressors is illustrated in FIG. 7. At the upper end of the curve, the curve becomes non-linear, i.e., at approximately −15 dB. Thus, in the illustrated embodiment, the RMS input threshold level of each compressor is about −15 dB. Moreover, the response curve for the three lower frequency bands deviates at 86 from the response curve for the highest frequency band at 88. Although the compressor curve of FIG. 7 is also non-linear at RMS input levels of −69 dB and below, this is non-linearity at the lower end is not present in all embodiments of the present invention.

Each of the frequency bands may correspond to a different respective gain characteristic. Further, each of the frequency bands may correspond to a different respective attack time and a different respective decay time.

Because most of the energy in the lowest frequency band (i.e., below 100 Hz) is monotone in nature, the left and right bands may be summed and controlled together in order to make multiband audio dynamics processor 20 more efficient.

Although not shown in the drawings, this summing may occur between multiband filters 24 and MDC 26.

Gain pullback control and/or feedback may be provided by Pullback RMS Detector Table module 90 (FIG. 6). An output 92 of Pullback RMS Detector Table 90 is multiplied with each of outputs 94$_{1-4}$ of RMS Detector Tables 8014 at multipliers 96$_{1-4}$. Outputs 98$_{1-4}$ of multipliers 96$_{1-4}$ are received by hold blocks 84$_{1-4}$. Outputs 100$_{1-4}$ of hold blocks 84$_{1-4}$ are received by respective gain adjusts 82$_{1-4}$. Thus, the gain applied to the individual bands by gain adjusts 82$_{1-4}$ is a function of input signal 32, the status of freeze/hold signal 100, the respective bands' RMS Detector Table output 94, and the output 92 of Pullback RMS Detector Table 90.

If output 30 of ALC 22 falls below the specified threshold, then the most recent output 94 of RMS Detector Table 80 (i.e., the most recent gain value) may be held until output 30 of ALC 22 exceeds the specified threshold. This holding constant of the gain value while the ALC signal is below the threshold value may prevent abrupt gain changes during quiet music passages. RMS table output gain values 94 may be a function of the input levels as represented by signals 32 of their respective frequency bands and of the compressor characteristics defined by the RMS Detector Tables 80.

Output signals 102$_2$ and 102$_3$ of Gain Adjusts 82$_2$ and 82$_3$, respectively, for the second and third frequency bands may be summed together at 104 in order to create a summed signal 106 received by Pullback RMS Detector Table 90 and used for controlling the pullback function. The outputs of only two Gain Adjusts 82$_2$ and 82$_3$ of the four Gain Adjusts 82$_{1-4}$ may be used as inputs to Pullback RMS Detector Table 90 because frequency bands B2 and B3 may have the most energy. Pullback RMS Detector Table 90 may function to prevent the output from going over scale by preventing the gain from becoming too high in an uncontrolled manner. The pullback function may prevent overload of final output audio signal 36 that may result when individual frequency bands B1-4 are summed back together at 108 to recreate the full audio spectrum left/right channels. Specifically, Pullback RMS Detector Table 90 may determine whether the sum of output signals 102$_2$ and 102$_3$ of Gain Adjusts 82$_2$ and 82$_3$ exceeds a threshold value.

MDC 26 may serve the function of applying a dynamic, source dependent equalization. MDC 26 may also increase the energy density of output signal 36 at times when the energy density of output signal 36 is relatively low. This functions performed by MDC 26 may result in a more powerful sound characteristic and may be applicable to both automotive audio systems and portable audio players.

The present invention may provide source level matching for a single media type as well as for different media types. Source levels for a given source, such as a CD player, can vary significantly, and thus may benefit from source level matching. The present invention may provide an improved method of source level matching with an automatic level control function that reduces the need for the end user to adjust the volume of different audio sources. Reducing the need for the user to adjust the volume may be especially beneficial in higher noise environments such as automobiles, or when the user is wearing headphone and his ears are thereby vulnerable to sudden increases in sound volume.

Figure 8:
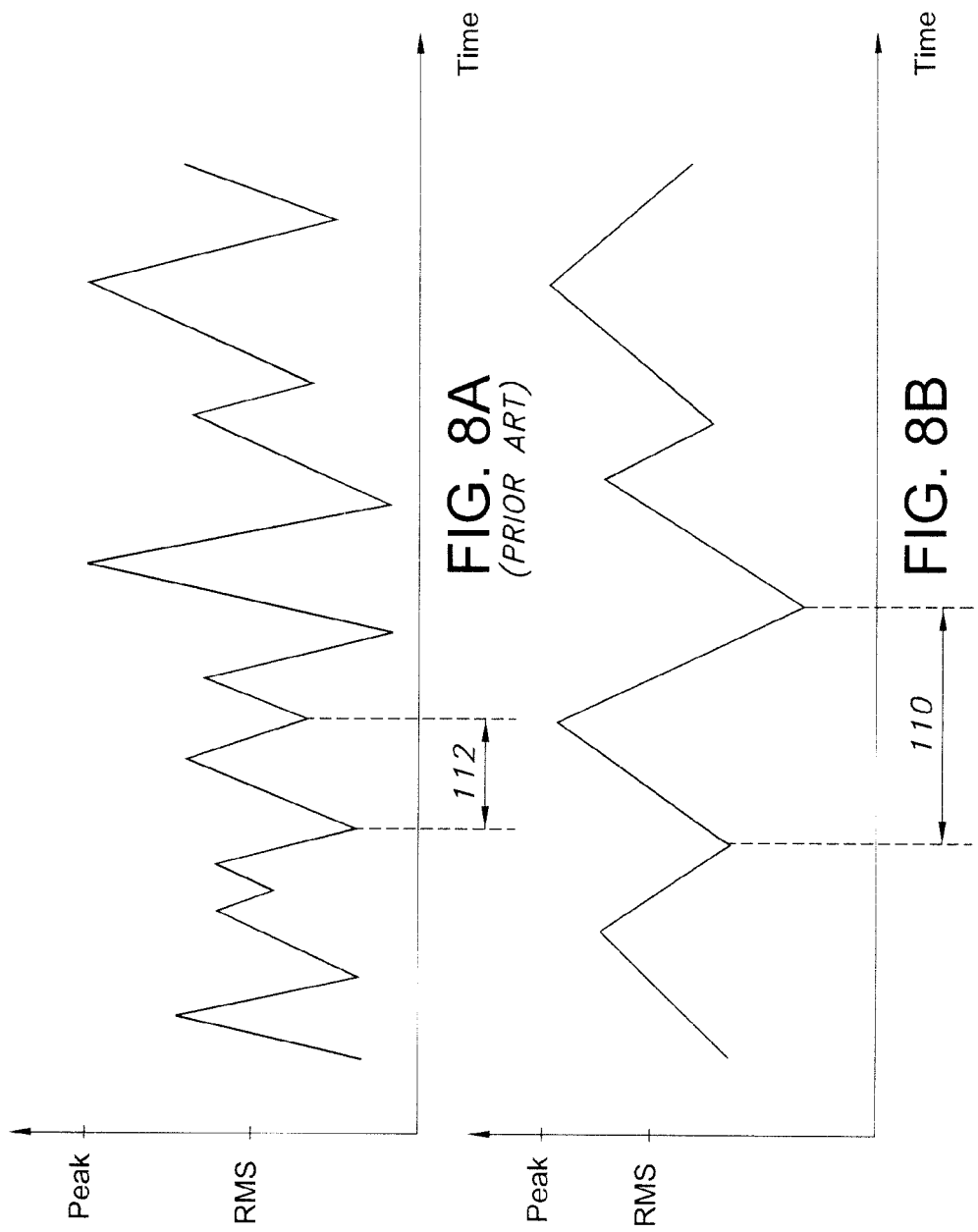
FIG. 8a is an exemplary plot of a prior art output audio signal.
FIG. 8b is an exemplary plot of an output audio signal of the multiband audio dynamics processor of FIG. 1.

The overall effect of the present invention on the output signal is illustrated via a comparison of FIGS. 8*a* and 8*b*. FIG. 8*a* is an exemplary plot of a prior art output signal having a Peak value and an RMS value as shown. FIG. 8*b* is an exemplary plot of an output signal achieved by use of the present invention. The plot of FIG. 8*b* also has a Peak value and an RMS value. However, the ratio of RMS value to Peak value in FIG. 8*b* is higher than is the ratio of RMS value to Peak value in FIG. 8*a*. The average of the output signal may also be a higher percentage of the Peak value as a result of the present invention. As the result of the present invention, a listener's perception may be that the sound is much louder and/or bigger.

The present invention may also have the effect of lengthening the time between adjacent peaks (i.e., local maximums) and between adjacent valleys (i.e., local minimums) in the output signal. For example, a time duration 110 between adjacent valleys of the output signal of the present invention is longer than a time duration 112 between adjacent valleys of the prior art output signal.

Figure 9:
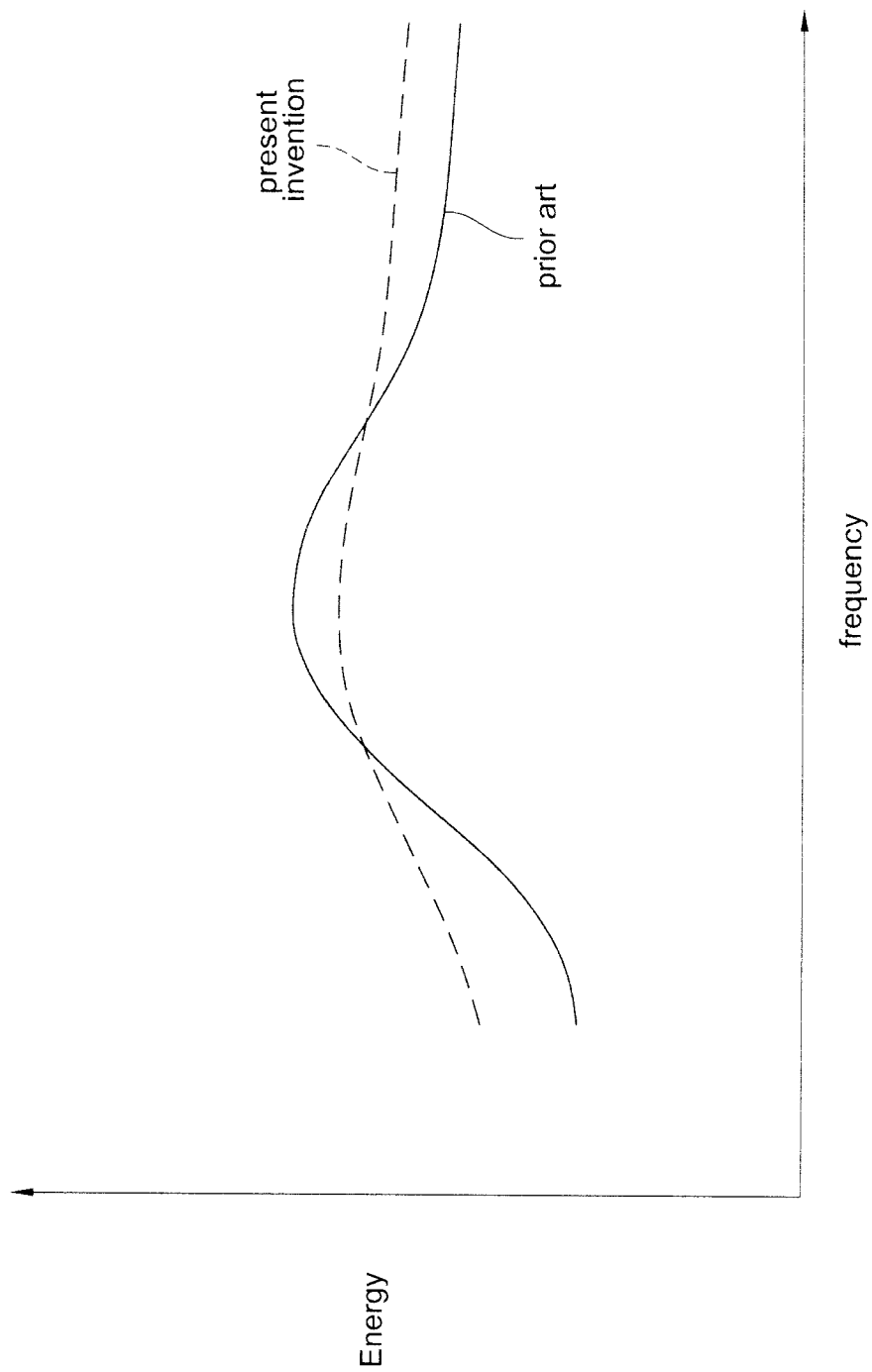
FIG. 9 illustrates exemplary plots of the energy versus frequency for an output audio signal of the multiband audio dynamics processor of FIG. 1 and for a prior art output audio signal.

Another illustration of the overall effect of the present invention on the output signal is presented in the energy versus frequency plot of FIG. 9. The output signal of the present invention has a lower peak or maximum energy than does the prior art output signal, but the energy at the lower frequencies and upper frequencies is higher with the present invention. As a result, the overall energy of the output signal, i.e., the integration of the area under the curve in FIG. 9, is greater with the present invention than with the prior art.

Figure 10:
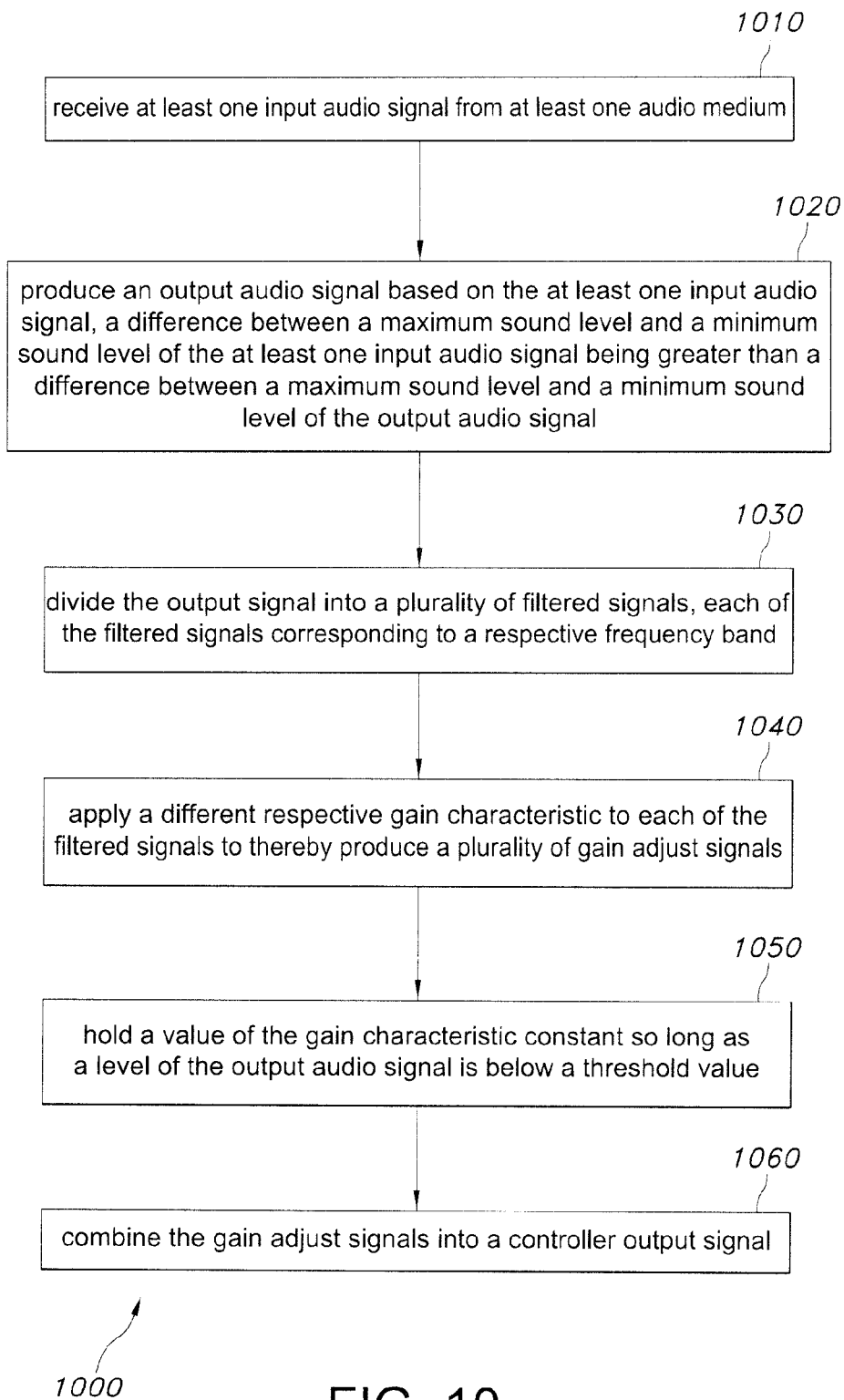
FIG. 10 is a flow chart of one embodiment of a method of the present invention for operating an audio system.

One embodiment of a method 1000 of the present invention for operating an audio system is illustrated in FIG. 10. In a first step 1010, at least one input audio signal is received from at least one audio medium. For example, an input audio signal in the form of a source input 28 (FIG. 1) may be received by ALC 22. Source input 28 may be from a radio, compact disc (CD) player, or other audio signal medium, for example.

In a next step 1020, an output audio signal is produced based on the at least one input audio signal, a difference between a maximum sound level and a minimum sound level of the at least one input audio signal being greater than a difference between a maximum sound level and a minimum sound level of the output audio signal. That is, an output audio signal 30 may be output from ALC 22 with adjusted sound levels relative to source input 28. Particularly, ALC 22 may reduce the difference in sound level between the loudest and quietest sections of source input 28 and output a resulting output audio signal 30.

Next, in step 1030, the output signal is divided into a plurality of filtered signals, each of the filtered signals corresponding to a respective frequency band. In the example illustrated in FIG. 4*a*, multiband filters 24 divide output audio signal 30 into four bandpass filtered signals 32 corresponding to frequency bands 0-100 Hz, 100 Hz-600 Hz, 600 Hz-4000 Hz, and over 4000 Hz, respectively.

In step 1040, a different respective gain characteristic is applied to each of the filtered signals to thereby produce a plurality of gain adjust signals. For example, within MDC 36, a different respective compressor curve (FIG. 7), i.e., gain characteristic, may be applied to each of the four bandpass filtered signals 32$_{1-4}$ to thereby produce gain adjust signals 102$_{1-4}$ (FIG. 6).

In a next step 1050, a value of the gain characteristic is held constant so long as a level of the output audio signal is below a threshold value. That is, when output audio signal 30 is below a threshold value, gate threshold detector 46 (FIG. 2) outputs gate control signal 34, which freezes or holds the gain setting of MDC 26 so long as output audio signal 30 remains below the threshold value.

In a final step 1060, the gain adjust signals are combined into a controller output signal. As shown in FIG. 6, gain adjust signals 102$_{1-4}$ are combined at 108 into a controller output signal 36.

As mentioned above, various numbers of compressor bands other than four or five could be utilized with the present invention. Moreover, filter types other than as shown in multiband filters 24 could be utilized. Lastly, although the present invention is described herein as functioning primarily digitally, an analog equivalent is within the scope of the invention.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An audio system, comprising:
    an automatic level controller configured to receive at least one input audio signal from at least one audio medium, said automatic level controller including a gain adjust module configured to produce an output audio signal based on the at least one input audio signal;
    a filter arrangement communicatively coupled to the automatic level controller, the filter arrangement being configured to receive the output audio signal and divide the output signal into a plurality of filtered signals, each of the filtered signals corresponding to a respective frequency band; and
    a multiband dynamics controller communicatively coupled to the filter arrangement, the multiband dynamics controller being configured to:
        receive the filtered signals and apply a different respective gain characteristic to each of the filtered signals to thereby produce a plurality of gain adjust signals; and
        combine the gain adjust signals into a multiband dynamics controller output signal.

2. The audio system of claim 1 wherein each of the gain characteristics is a function of a level of the respective filtered signal.

3. The audio system of claim 1 further comprising a threshold detector module communicatively coupled to the gain adjust module and configured to determine whether the output audio signal is below a predetermined threshold value.

4. The audio system of claim 3 wherein the multiband dynamics controller is configured to receive a signal from the threshold detector module and adjust at least one of the gain adjust signals based upon the signal from the threshold detector module.

5. The audio system of claim 1 wherein each of the frequency bands corresponds to a predominant frequency of a selected type of musical instrument.

6. The audio system of claim 1 wherein the multiband dynamics controller includes a pullback module configured to receive at least one of the gain adjust signals and provide feedback to reduce at least one of the gain adjust signals if the received gain adjust signal exceeds a threshold value.

7. The audio system of claim 1 wherein the filter arrangement comprises a plurality of lowpass filters, a plurality of inverters, and a plurality of adders.

8. An audio system, comprising:
    an automatic level controller configured to receive at least one input audio signal from at least one audio medium, said automatic level controller including a gain adjust module configured to produce an output audio signal based on the at least one input audio signal;
    a filter arrangement communicatively coupled to the automatic level controller, the filter arrangement being configured to receive the output audio signal and divide the output signal into a plurality of filtered signals, each of the filtered signals corresponding to a respective frequency band; and
    a multiband dynamics controller communicatively coupled to the filter arrangement, the multiband dynamics controller being configured to receive the filtered signals and apply a different respective gain characteristic to each of the filtered signals to thereby produce a plurality of gain adjust signals, wherein the automatic level controller is further configured to hold respective values of the gain characteristics substantially constant.

9. The audio system of claim 8 wherein the multiband dynamics controller is configured to combine the gain adjust signals into a multiband dynamics controller output signal.

10. The audio system of claim 8 wherein each of the gain characteristics is a function of a level of the respective filtered signal.

11. The audio system of claim 8 further comprising a threshold detector module communicatively coupled to the gain adjust module and configured to determine whether the output audio signal is below a predetermined threshold value, and wherein the multiband dynamics controller is configured to receive a signal from the threshold detector module and adjust at least one of the gain adjust signals based upon the signal from the threshold detector module.

12. The audio system of claim 8 wherein each of the frequency bands corresponds to a predominant frequency of a selected type of musical instrument.

13. The audio system of claim 8 wherein the multiband dynamics controller includes a pullback module configured to receive at least one of the gain adjust signals and provide feedback to reduce at least one of the gain adjust signals if the received gain adjust signal exceeds a threshold value.

14. The audio system of claim 8 wherein the filter arrangement comprises a plurality of lowpass filters, a plurality of inverters, and a plurality of adders.

15. The audio system of claim 8 wherein the automatic level controller is configured to hold respective values of the gain characteristics substantially constant until the output audio signal rises above a threshold value.

16. An audio system, comprising:
    a gain adjust module configured to produce an output audio signal based on at least one input audio signal;
    a threshold detector module communicatively coupled to the gain adjust module and configured to receive the output audio signal and transmit a gate control signal in response to the output audio signal falling below a threshold value;
    a filter arrangement communicatively coupled to the gain adjust module, the filter arrangement being configured to receive the output audio signal and produce a plurality of filtered signals based on the output audio signal; and
    a multiband dynamics controller communicatively coupled to the filter arrangement, the multiband dynamics controller being configured to:
        receive the filtered signals and apply a respective gain characteristic to each of the filtered signals to thereby produce a plurality of gain adjust signals; and
        receive the gate control signal and limit at least one of the gain adjust signals to a maximum value in response to receiving the gate control signal.

17. The audio system of claim 16 wherein each of the gain characteristics is a function of a level of the respective filtered signal.

18. The audio system of claim 16 further comprising a threshold detector module communicatively coupled to the gain adjust module and configured to determine whether the output audio signal is below a predetermined threshold value, and wherein the multiband dynamics controller is configured to receive a signal from the threshold detector module and adjust at least one of the gain adjust signals based upon the signal from the threshold detector module.

19. The audio system of claim 16 wherein each of the filtered signals corresponds to a respective frequency band, and each of the frequency bands corresponds to a predominant frequency of a selected type of musical instrument.

20. The audio system of claim 16 wherein the multiband dynamics controller includes a pullback module configured to receive at least one of the gain adjust signals and provide feedback to reduce at least one of the gain adjust signals if the received gain adjust signal exceeds a threshold value.

* * * * *